US011043927B2

(12) United States Patent
Xu et al.

(10) Patent No.: US 11,043,927 B2
(45) Date of Patent: Jun. 22, 2021

(54) SIGNAL AMPLIFICATION STRUCTURE AND COMMUNICATION DEVICE

(71) Applicant: SMARTER MICROELECTRONICS (GUANG ZHOU) CO., LTD., Guangzhou (CN)

(72) Inventors: Baiming Xu, Guangzhou (CN); Qiang Su, Guangzhou (CN); Zhenfei Peng, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 157 days.

(21) Appl. No.: 16/409,862

(22) Filed: May 12, 2019

(65) Prior Publication Data

US 2019/0267958 A1    Aug. 29, 2019

Related U.S. Application Data

(63) Continuation of application No. PCT/CN2017/101306, filed on Sep. 11, 2017.

(30) Foreign Application Priority Data

Dec. 8, 2016 (CN) .......................... 201611123724.0

(51) Int. Cl.
  H03F 1/22    (2006.01)
  H03F 3/68    (2006.01)
  H03F 1/26    (2006.01)
(52) U.S. Cl.
  CPC .................. *H03F 3/68* (2013.01); *H03F 1/26* (2013.01); *H03F 2200/451* (2013.01)
(58) Field of Classification Search
  CPC ........................................................ H03F 1/22
  USPC ................................................... 330/310, 311
  See application file for complete search history.

(56) References Cited

U.S. PATENT DOCUMENTS 4,015,215 A * 3/1977 Seki ...................... H03F 3/3084
                                                                 330/273

* cited by examiner

*Primary Examiner* — Henry Choe
(74) *Attorney, Agent, or Firm* — Syncoda LLC; Feng Ma

(57) ABSTRACT

A signal amplifier includes one or more driver stage amplifiers and a power stage amplifier. The one or more driver stage amplifiers are connected in series. The one or more driver stage amplifiers and the power stage amplifier are connected to the same power supply, such that each of the at least one driver stage amplifier forms a loop with the power stage amplifier. The signal amplifier can further include a wave trap unit configured to block an oscillation frequency in the loop. One terminal of the wave trap unit is connected to the loop. The other terminal of the wave trap unit is grounded.

7 Claims, 2 Drawing Sheets

SIGNAL AMPLIFICATION STRUCTURE AND COMMUNICATION DEVICE

CROSS-REFERENCE TO RELATED APPLICATIONS

The present application is a continuation of, and claims priority to, international application no. PCT/CN2017/101306 filed on Sep. 11, 2017, which claims priority to Chinese Patent Application No. 201611123724.0 filed on Dec. 8, 2016. The disclosures of these applications are hereby incorporated by reference in their entirety.

BACKGROUND

As users' requirements on the qualities of wireless communication become increasingly higher, the requirement on the power of a power amplifier applied to communication signal transmission thus becomes increasing higher. It has been difficult to meet users' needs using a single-stage amplifier, and a multistage amplifier becomes a common design means. However, if each amplifier stage in a multistage amplifier is powered separately, the circuit will be complex and redundant. Thus, a common method for solving such a problem is using a same power supply (namely a common power source) to power the multistage amplifier, as illustrated in FIG. 1.

SUMMARY

The present disclosure relates to the wireless communication technology, and specifically to a signal amplification structure and a communication device.

In order to solve the existing technical problems, the disclosure provides a signal amplification structure and a communication device.

To this end, technical solutions according to embodiments of the disclosure are implemented as follows.

The disclosure provides a signal amplification structure. The signal amplification structure includes: at least one driver stage amplifier and a power stage amplifier. The at least one driver stage amplifier is connected in series. The at least one driver stage amplifier and the power stage amplifier are connected to the same power supply, so that each of the at least one driver stage amplifier forms a loop with the power stage amplifier.

The signal amplification structure further includes a wave trap unit, which is configured to block an oscillation frequency in the loop. One end of the wave trap unit is connected to the loop, and the other end of the wave trap unit is grounded.

In an embodiment, the driver stage amplifier and the wave trap unit form a first branch, and the power stage amplifier and the wave trap unit form a second branch.

The wave trap unit includes a first capacitor and a first inductor. A first end of the first capacitor is connected to the loop. A second end of the first capacitor is connected with the first end of the first inductor. The second end of the first inductor is grounded.

In an embodiment, the signal amplification structure further includes a first low-pass filtering unit arranged on the first branch, which is configured to cut off a high-frequency signal in the loop and filter a signal having a first specific frequency in the first branch.

In an embodiment, the signal amplification structure further includes a second low-pass filtering unit arranged on the second branch, which is configured to cut off the high-frequency signal in the loop and filter a signal having a second specific frequency, in the second branch.

In an embodiment, the first low-pass filtering unit includes a second inductor and the first capacitor. The second inductor is connected in the first loop in series. The second end of the second inductor is connected with the first end of the first capacitor.

In an embodiment, the second low-pass filtering unit includes a third inductor and the first capacitor. The third inductor is connected in the second loop in series. The first end of the third inductor is connected with the first end of the first capacitor.

The disclosure also provides a communication device. The communication device includes the signal amplification structure of the disclosure.

According to the signal amplification structure and the communication device provided by embodiments of the disclosure, the signal amplification structure includes: at least one driver stage amplifier and a power stage amplifier. The at least one driver stage amplifier is connected in series. The at least one driver stage amplifier and the power stage amplifier are connected to a same power supply, so that each of the at least one driver stage amplifier forms a loop with the power stage amplifier. The signal amplification structure further includes a wave trap unit configured to block an oscillation frequency in the loop. One end of the wave trap unit is connected to the loop, and the other end of the wave trap unit is grounded. In this way, by means of the technical solutions according to embodiments of the disclosure, a wave trap unit is added in a loop formed by at least two amplifiers using a same power supply, thereby an oscillation frequency in the loop is suppressed, and the stability in power amplification is improved.

DETAILED DESCRIPTION

The disclosure is further elaborated below in combination with the accompanying drawings and specific embodiments.

Figure 1:
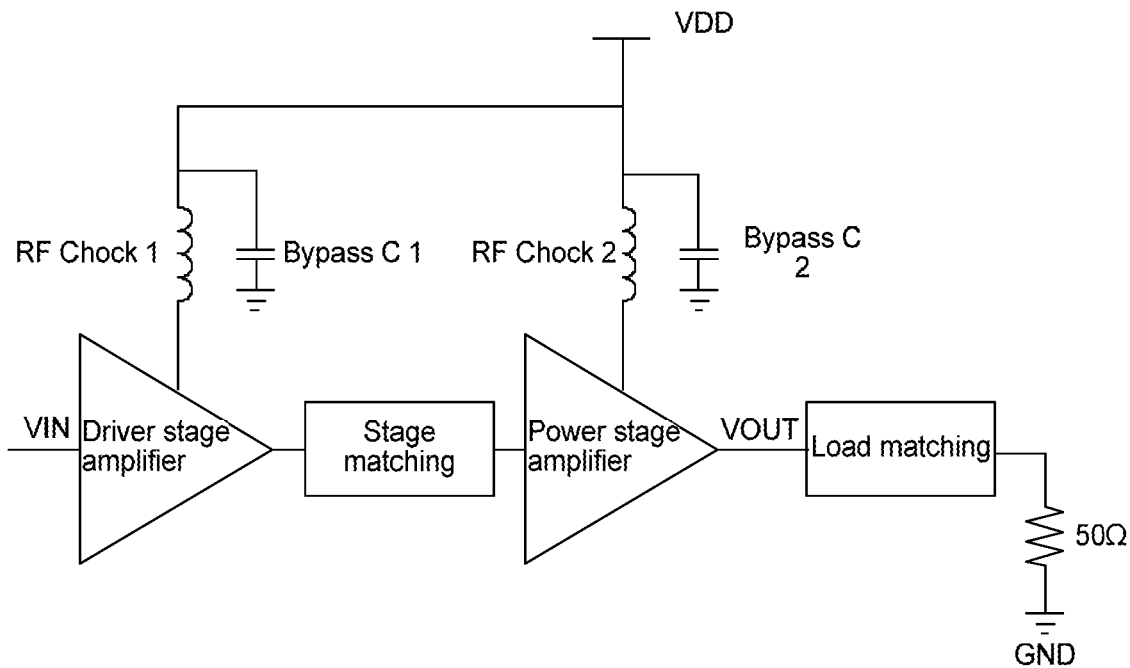
FIG. 1 illustrates a schematic diagram showing circuit composition of a signal amplification structure in the related art.

The inventors of the present disclosure have recognized that, using the same power supply will result in several problems. For example, with reference to FIG. 1, a loop forms because a driver stage amplifier and a power stage amplifier share a power supply, so that the driver stage amplifier and the power stage amplifier influence each other, which causes instability in power amplification.

Figure 2:
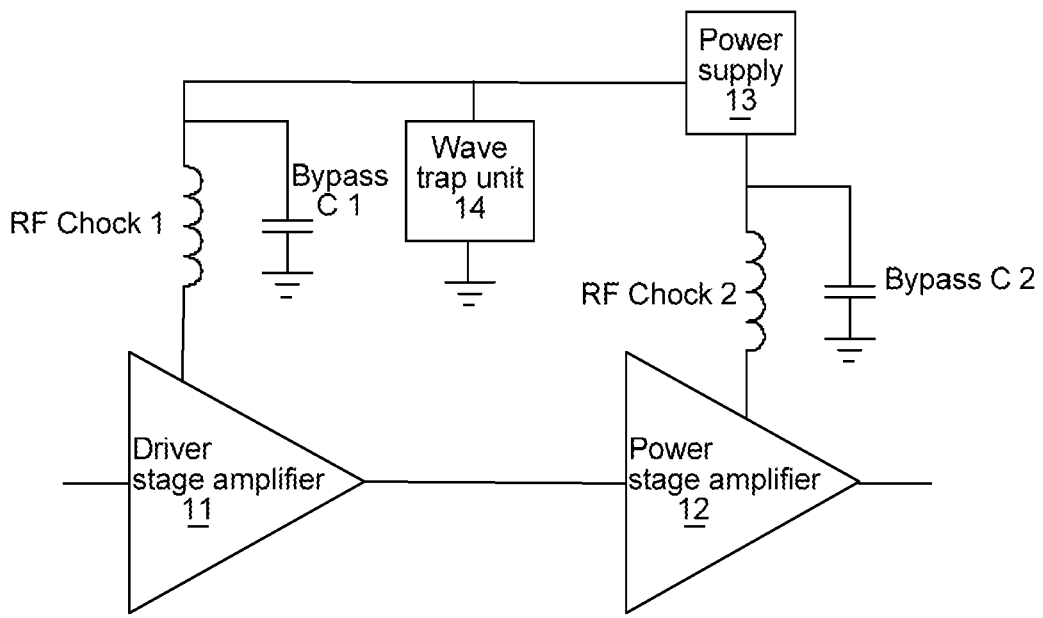
FIG. 2 illustrates a structural diagram of a signal amplification structure according to an embodiment of the disclosure.

A first embodiment of the disclosure provides a signal amplification structure. FIG. 2 illustrates a structural diagram of the signal amplification structure according to the embodiment of the disclosure. As illustrated in FIG. 2, the signal amplification structure includes: at least one driver stage amplifier 11 and a power stage amplifier 12. The at least one driver stage amplifier 11 is connected in series. The at least one driver stage amplifier 11 and the power stage amplifier 12 are connected to a same power supply 13, so that each of the at least one driver stage amplifier 11 forms a loop with the power stage amplifier 12.

The signal amplification structure further includes a wave trap unit 14 configured to block an oscillation frequency in the loop. One end of the wave trap unit 14 is connected to the loop, and the other end of the wave trap unit 14 is grounded. In FIG. 2, an illustration is given by taking that the signal amplification structure includes one driver stage amplifier 11 and one power stage amplifier 12 as an example, but in other implementation modes, the signal amplification structure may include at least one driver stage amplifier 11. The at least one driver stage amplifier 11 is connected in series.

The signal amplification structure according to the embodiment of the disclosure is applied in a communication device. In order to meet the wireless communication quality of the communication device, at least two amplifiers may be arranged in the signal amplification structure. The at least two amplifiers are connected to the same power supply. The at least two amplifiers may include at least one driver stage amplifier and the power stage amplifier. When connected to the same power supply, each driver stage amplifier and the power stage amplifier of the at least two amplifiers form a loop because of being connected to the same power supply, thus the two amplifiers will influence each other, which results in instability in power amplification. Based on this, in the present embodiment, a wave trap unit 14 is arranged in the formed loop. As illustrated in FIG. 2 in which the signal amplification structure only includes the driver stage amplifier 11 and the power stage amplifier 12, the driver stage amplifier 11 and the power stage amplifier 12 form a loop while being connected to the same power supply 13. There is a wave trap unit 14 arranged in the signal amplification structure. One end of the wave trap unit 14 is connected to the loop, and the other end of the wave trap unit 14 is grounded.

According to an oscillation frequency generated by the driver stage amplifier 11 and the power stage amplifier 12, the oscillation frequency formed in the loop by the driver stage amplifier 11 and the power stage amplifier 12 may be blocked by using a low impedance formed by the wave trap unit 14.

As an implementation mode, with reference to FIG. 2, there are also a capacitor 1 (Bypass C1) and a capacitor 2 (Bypass C2) arranged in the signal amplification structure. An output impedance of the driver stage amplifier 11 and the power stage amplifier 12 will be influenced respectively by the capacitor 1 (Bypass C1) and the capacitor 2 (Bypass C2) in a radio frequency band. Because the capacitor 1 and the capacitor 2 each have a relatively large capacitance and are nF-level capacitors, in the radio frequency band, each is equivalent to a small inductor connected in parallel with a load impedance, thus influencing the load impedance of the driver stage amplifier 11 and the power stage amplifier 12. Based on this, the signal amplification structure further includes a first low-pass filtering unit arranged on the first branch, which is configured to cut off a high-frequency signal in the loop and filter out a signal having a first specific frequency in a first branch. The signal amplification structure further includes a second low-pass filtering unit arranged on the second branch, which is configured to cut off the high-frequency signal in the loop and filter out a signal having a second specific frequency in a second branch.

Figure 3:
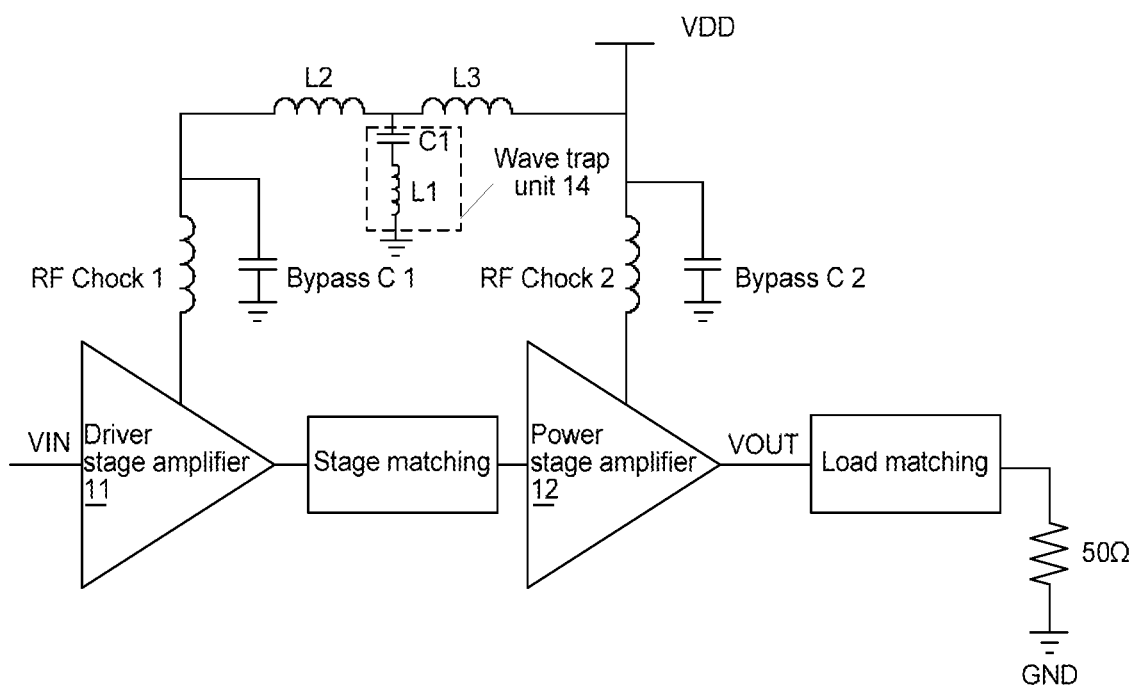
FIG. 3 illustrates a schematic diagram showing circuit composition of a signal amplification structure according to an embodiment of the disclosure.

Specifically, FIG. 3 illustrates a schematic diagram showing circuit composition of a signal amplification structure according to an embodiment of the disclosure. As illustrated in FIG. 3, the driver stage amplifier 11 and the wave trap unit 14 form the first branch, the power stage amplifier 12 and the wave trap unit 14 form the second branch, the wave trap unit 14 includes a first capacitor C1 and a first inductor L1, a first end of the first capacitor C1 is connected to the loop, a second end of the first capacitor C1 is connected with the first end of the first inductor L1, and the second end of the first inductor L1 is grounded.

Specifically, the wave trap unit 14 may include the first capacitor C1 and the first inductor L1. Values of the first capacitor C1 and the first inductor L1 in the wave trap unit 14 are determined according to the oscillation frequency generated in the loop. Specifically, a capacitance value of the first capacitor C1 and an inductance value of the first inductor L1 adapt to the oscillation frequency in the loop. As an implementation mode, a relationship between the capacitance value of the first capacitor C1 and the inductance value of the first inductor L1 and the oscillation frequency in the loop satisfies the formula:

$$f = \frac{1}{2\pi\sqrt{L \times C}},$$

where f is the oscillation frequency, L is the inductance value of the first inductor L1, and C is the capacitance value of the first capacitor C1. As an implementation mode, the first low-pass filtering unit includes a second inductor L2 and the first capacitor C1. The second inductor L2 is connected in the first loop in series. The second end of the second inductor L2 is connected with the first end of the first capacitor C1.

Correspondingly, the second low-pass filtering unit includes a third inductor L3 and the first capacitor C1. The third inductor L3 is connected in the second loop in series. The first end of the third inductor L3 is connected with the first end of the first capacitor C1.

Specifically, in the present embodiment, respective inductors may be arranged on the first branch and the second branch. The inductors and the first capacitor C1 in the wave trap unit form low-pass filtering structures (namely a first low-pass filtering structure and a second low-pass filtering structure) respectively on the first branch and the second branch. The first low-pass filtering structure and the second low-pass filtering structure form high impedance in the radio frequency band respectively on the driver stage amplifier and the power stage amplifier in the loop, thereby playing a role of isolating the driver stage amplifier and the power stage amplifier. Certainly, the low-pass filtering structures respectively formed by the first low-pass filtering unit and the second low-pass filtering unit can better play a role of isolating the driver stage amplifier and the power stage amplifier.

By means of the technical solutions according to embodiments of the disclosure, on one hand, the wave trap unit is added in the loop formed by two amplifiers using the same power supply, thereby the oscillation frequency in the loop is suppressed, and the stability in power amplification is improved. On the other hand, through the low-pass filtering structures respectively formed by the first low-pass filtering unit and the second low-pass filtering unit, the high impedance presents in the radio frequency band respectively on the driver stage amplifier and the power stage amplifier, and the driver stage amplifier and the power stage amplifier are isolated from each other, so that the capacitor Bypass C1 and the capacitor Bypass C2 in the signal amplification structure will not influence the load impedances of the driver stage amplifier and the power stage amplifier.

The disclosure also provides a communication device in a second embodiment. The communication device can be, for example, a mobile phone, which can further include, for example, a display, an antenna, a microphone, a speaker, etc.

The communication device includes the signal amplification structure of the first embodiment. Specifically, as shown in FIG. 2, the signal amplification structure includes: at least one driver stage amplifier 11 and the power stage amplifier 12. The at least one driver stage amplifier 11 is connected in series. The at least one driver stage amplifier 11 and the power stage amplifier 12 are connected to the same power supply 13, so that each of the at least one driver stage amplifier 11 forms a loop with the power stage amplifier 12.

The signal amplification structure further includes the wave trap unit 14 configured to block the oscillation frequency in the loop. One end of the wave trap unit 14 is connected to the loop, and the other end of the wave trap unit 14 is grounded.

In some embodiments of the disclosure, in order to meet the wireless communication quality of the communication device, at least two amplifiers may be arranged in the signal amplification structure. The at least two amplifiers are connected to a same power supply. The at least two amplifiers may include at least one driver stage amplifier and the power stage amplifier. When connected to the same power supply, each driver stage amplifier and the power stage amplifier of the at least two amplifiers form a loop because of being connected to the same power supply, thus the two amplifiers will influence each other, which causes instability in power amplification. Based on this, in the present embodiment, a wave trap unit 14 is arranged in the formed loop. As illustrated in FIG. 2, the signal amplification structure only includes the driver stage amplifier 11 and the power stage amplifier 12, the driver stage amplifier 11 and the power stage amplifier 12 form a loop while being connected to the same power supply 13. There is the wave trap unit 14 arranged in the signal amplification structure. One end of the wave trap unit 14 is connected to the loop, and the other end of the wave trap unit 14 is grounded. According to the oscillation frequency generated by the driver stage amplifier 11 and the power stage amplifier 12, the oscillation frequency formed in the loop by the driver stage amplifier 11 and the power stage amplifier 12 may be blocked by using a low impedance formed by the wave trap unit 14.

As an implementation mode, with reference to FIG. 2, there are also the capacitor 1 (Bypass C1) and the capacitor 2 (Bypass C2) arranged in the signal amplification structure. An output impedance of the driver stage amplifier 11 and the power stage amplifier 12 will be influenced respectively by the capacitor 1 (Bypass C1) and the capacitor 2 (Bypass C2) in a radio frequency band. Because the capacitor 1 and the capacitor 2 each have a relatively large capacitance and are nF-level capacitors, in the radio frequency band, each is equivalent to a small inductor connected in parallel with a load impedance, thus influencing the load impedance of the driver stage amplifier 11 and the power stage amplifier 12. Based on this, the signal amplification structure further includes the first low-pass filtering unit arranged on the first branch, which is configured to cut off the high-frequency signal in the loop and filter out a signal having the first specific frequency in a first branch. The signal amplification structure further includes the second low-pass filtering unit arranged on the second branch, which is configured to cut off the high-frequency signal in the loop and filter out a signal having the second specific frequency, in a second branch.

Specifically, as illustrated in FIG. 3, the driver stage amplifier 11 and the wave trap unit 14 form the first branch, the power stage amplifier 12 and the wave trap unit 14 form the second branch, the wave trap unit 14 includes the first capacitor C1 and the first inductor L1, the first end of the first capacitor C1 is connected to the loop, the second end of the first capacitor C1 is connected with the first end of the first inductor L1, and the second end of the first inductor L1 is grounded.

Specifically, the wave trap unit 14 may include the first capacitor C1 and the first inductor L1. The values of the first capacitor C1 and the first inductor L1 in the wave trap unit 14 are determined according to the oscillation frequency generated in the loop. Specifically, the capacitance value of the first capacitor C1 and the inductance value of the first inductor L1 adapt to the oscillation frequency in the loop. As an implementation mode, the relationship between the capacitance value of the first capacitor C1 and the inductance value of the first inductor L1 and the oscillation frequency in the loop satisfies the formula:

$$f = \frac{1}{2\pi\sqrt{L \times C}},$$

where f is the oscillation frequency, L is the inductance value of the first inductor L1, and C is the capacitance value of the first capacitor C1. As an implementation mode, the first low-pass filtering unit includes the second inductor L2 and the first capacitor C1. The second inductor L2 is connected in the first loop in series. The second end of the second inductor L2 is connected with the first end of the first capacitor C1.

Correspondingly, the second low-pass filtering unit includes the third inductor L3 and the first capacitor C1. The third inductor L3 is connected in the second loop in series. The first end of the third inductor L3 is connected with the first end of the first capacitor C1.

Specifically, in the present embodiment, respective inductors may be arranged on the first branch and the second branch. The inductors and the first capacitor C1 in the wave trap unit 14 form the low-pass filtering structures (namely the first low-pass filtering structure and the second low-pass filtering structure) respectively on the first branch and the second branch. The first low-pass filtering structure and the second low-pass filtering structure form the high impedance in the radio frequency band respectively on the driver stage amplifier and the power stage amplifier in the loop, thereby playing a role of isolating the driver stage amplifier and the power stage amplifier. Certainly, the low-pass filtering structures respectively formed by the first low-pass filtering unit and the second low-pass filtering unit can better play a role of isolating the driver stage amplifier and the power stage amplifier.

By means of the technical solutions according to embodiments of the disclosure, on one hand, the wave trap unit is added in the loop formed by two amplifiers using the same power supply, thereby the oscillation frequency in the loop is suppressed, and the stability in power amplification is improved. On the other hand, through the low-pass filtering structures respectively formed by the first low-pass filtering unit and the second low-pass filtering unit, the high impedance presents in the radio frequency band respectively on the driver stage amplifier and the power stage amplifier, and the driver stage amplifier and the power stage amplifier are isolated from each other, so that the capacitor Bypass C1 and the capacitor Bypass C2 in the signal amplification structure will not influence the load impedances of the driver stage amplifier and the power stage amplifier.

In the several embodiments provided in the present application, it should be understood that the device disclosed may be realized in other ways. The embodiment of the device described above is only schematic; for example, the division of the units is only a division of logical functions, and there may be other dividing modes during the actual implementation, for example, multiple units or components may be combined or integrated to another system, or some features may be ignored or are not executed. In addition, coupling, direct coupling, or communication connection illustrated or discussed may be implemented through indirect coupling or communication connection of some interfaces, devices or units, and may be in an electrical form, a mechanical form or other forms.

The above is only the specific embodiments of the disclosure and not intended to limit the protection scope of the disclosure; any change or replacement that those skilled in the art can think of easily in the scope of technologies disclosed by the disclosure shall fall within the protection scope of the disclosure. Therefore, the protection scope of the disclosure is subject to the protection scope of the claims.

By means of the technical solutions according to embodiments of the disclosure, a wave trap unit is added in a loop formed by at least two amplifiers using a same power supply, thereby an oscillation frequency in the loop is suppressed, and the stability in power amplification is improved.

The invention claimed is:

1. A signal amplifier, comprising: at least one driver stage amplifier and a power stage amplifier, wherein the at least one driver stage amplifier is connected in series; the at least one driver stage amplifier and the power stage amplifier are connected to a same power supply, such that each of the at least one driver stage amplifier forms a loop with the power stage amplifier; and the signal amplifier further comprises a wave trap unit configured to block an oscillation frequency in the loop, wherein one end of the wave trap unit is connected to the loop, and the other end of the wave trap unit is grounded;

wherein the driver stage amplifier and the wave trap unit form a first branch, and the power stage amplifier and the wave trap unit form a second branch; and the wave trap unit comprises a first capacitor and a first inductor, wherein a first end of the first capacitor is connected to the loop, a second end of the first capacitor is connected with a first end of the first inductor, and a second end of the first inductor is grounded.

2. The signal amplifier of claim 1, further comprising: a first low-pass filtering unit arranged on the first branch, the first filtering unit being configured to cut off a high-frequency signal in the loop and filter out a signal having a first specific frequency in the first branch.

3. The signal amplifier of claim 2, further comprising: a second low-pass filtering unit arranged on the second branch, the second filtering unit being configured to cut off a high-frequency signal in the loop and filter out a signal having a second specific frequency in the second branch.

4. The signal amplifier of claim 2, wherein the first low-pass filtering unit comprises a second inductor and the first capacitor, wherein the second inductor is connected in the first loop in series, and a second end of the second inductor is connected with the first end of the first capacitor.

5. The signal amplifier of claim 3, wherein the second low-pass filtering unit comprises a third inductor and the first capacitor, wherein the third inductor is connected in the second loop in series, and a first end of the third inductor is connected with the first end of the first capacitor.

6. A communication device comprising the signal amplifier of claim 1.

7. The communication device of claim 6, wherein the communication device is a mobile phone and further comprises a display, an antenna, a microphone, and a speaker.

* * * * *